United States Patent
Babayan et al.

(10) Patent No.: US 10,474,033 B2
(45) Date of Patent: Nov. 12, 2019

(54) METHOD AND APPARATUS FOR POST EXPOSURE PROCESSING OF PHOTORESIST WAFERS

(71) Applicant: Applied Materials, Inc., Santa Clara, CA (US)

(72) Inventors: Viachslav Babayan, Sunnyvale, CA (US); Douglas A. Buchberger, Jr., Livermore, CA (US); Qiwei Liang, Fremont, CA (US); Ludovic Godet, Sunnyvale, CA (US); Srinivas D. Nemani, Sunnyvale, CA (US); Daniel J. Woodruff, Kalispell, MT (US); Randy Harris, Kalispell, CA (US); Robert B. Moore, Bigfork, MT (US)

(73) Assignee: Applied Materials, Inc., Santa Clara, CA (US)

( * ) Notice: Subject to any disclaimer, the term of this patent is extended or adjusted under 35 U.S.C. 154(b) by 133 days.

(21) Appl. No.: 15/692,087

(22) Filed: Aug. 31, 2017

(65) Prior Publication Data
US 2017/0363960 A1    Dec. 21, 2017

Related U.S. Application Data

(63) Continuation of application No. 14/989,488, filed on Jan. 6, 2016, now Pat. No. 10,203,604.

(60) Provisional application No. 62/267,531, filed on Dec. 15, 2015, provisional application No. 62/261,171, filed on Nov. 30, 2015.

(51) Int. Cl.
*G03D 5/00*    (2006.01)
*G03F 7/20*    (2006.01)
*H01L 21/687*    (2006.01)
*G03F 7/16*    (2006.01)
*G03F 7/26*    (2006.01)
*G03F 7/38*    (2006.01)

(52) U.S. Cl.
CPC ............ *G03F 7/2035* (2013.01); *G03F 7/168* (2013.01); *G03F 7/26* (2013.01); *G03F 7/38* (2013.01); *H01L 21/68764* (2013.01)

(58) Field of Classification Search
USPC ........................................................ 396/611
See application file for complete search history.

(56) References Cited

U.S. PATENT DOCUMENTS 5,685,949 A * 11/1997 Yashima ........... H01J 37/32082
                                                           134/1.1
6,261,744 B1    7/2001 Yoshioka
(Continued)

FOREIGN PATENT DOCUMENTS

WO    2008-085681 A2    7/2008

*Primary Examiner* — Rodney E Fuller
(74) *Attorney, Agent, or Firm* — Patterson + Sheridan, LLP (57) ABSTRACT

Embodiments described herein relate to methods and apparatus for performing immersion field guided post exposure bake processes. Embodiments of apparatus described herein include a chamber body defining a processing volume. A pedestal may be disposed within the processing volume and a first electrode may be coupled to the pedestal. A moveable stem may extend through the chamber body opposite the pedestal and a second electrode may be coupled to the moveable stem. In certain embodiments, a fluid containment ring may be coupled to the pedestal and a dielectric containment ring may be coupled to the second electrode.

18 Claims, 9 Drawing Sheets

(56) References Cited

U.S. PATENT DOCUMENTS

| | | | |
|---|---|---|---|
| 6,686,132 B2 | 2/2004 | Cheng et al. | |
| 6,841,342 B2* | 1/2005 | Nishi | G03F 7/38 |
| | | | 118/302 |
| 6,875,466 B2 | 4/2005 | Matsui et al. | |
| 7,537,672 B1* | 5/2009 | Koshiishi | H01J 37/32082 |
| | | | 118/723 E |
| 8,097,402 B2 | 1/2012 | Scheer et al. | |
| 8,288,174 B1 | 10/2012 | Rathsack et al. | |
| 10,203,604 B2* | 2/2019 | Babayan | G03F 7/2035 |
| 2003/0032302 A1* | 2/2003 | Nishi | G03F 7/38 |
| | | | 438/758 |
| 2004/0206373 A1 | 10/2004 | Donoso et al. | |
| 2005/0074706 A1* | 4/2005 | Bristol | B82Y 10/00 |
| | | | 430/327 |
| 2008/0050679 A1 | 2/2008 | Salek et al. | |
| 2008/0135207 A1 | 6/2008 | Fukuoka et al. | |
| 2008/0304940 A1 | 12/2008 | Auer-Jongepier et al. | |
| 2011/0269314 A1 | 11/2011 | Lee et al. | |
| 2013/0333616 A1* | 12/2013 | Klindworth | C23C 16/50 |
| | | | 118/719 |
| 2016/0139503 A1 | 5/2016 | Ramaswamy et al. | |

* cited by examiner

METHOD AND APPARATUS FOR POST EXPOSURE PROCESSING OF PHOTORESIST WAFERS

CROSS REFERENCE TO RELATED APPLICATIONS

This application is a continuation of U.S. patent application Ser. No. 14/989,488, filed Jan. 6, 2016, which claims benefit to U.S. Provisional Patent Application No. 62/261,171, filed Nov. 30, 2015, and U.S. Provisional Patent Application No. 62/267,531, filed Dec. 15, 2015, all of which are hereby incorporated by reference in their entirety.

BACKGROUND

Field

The present disclosure generally relates to methods and apparatus for processing a substrate, and more specifically to methods and apparatus for improving photolithography processes.

Description of the Related Art

Integrated circuits have evolved into complex devices that can include millions of components (e.g., transistors, capacitors and resistors) on a single chip. Photolithography is a process that may be used to form components on a chip. Generally the process of photolithography involves a few basic stages. Initially, a photoresist layer is formed on a substrate. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, for example, a 193 nm ArF laser, an electron beam, an ion beam, or other suitable source.

In an exposure stage, a photomask or reticle may be used to selectively expose certain regions of the substrate to electromagnetic radiation. Other exposure methods may be maskless exposure methods. Exposure to light may decompose the photo acid generator, which generates acid and results in a latent acid image in the resist resin. After exposure, the substrate may be heated in a post-exposure bake process. During the post-exposure bake process, the acid generated by the photoacid generator reacts with the resist resin, changing the solubility of the resist during the subsequent development process.

After the post-exposure bake, the substrate, particularly the photoresist layer, may be developed and rinsed. Depending on the type of photoresist used, regions of the substrate that were exposed to electromagnetic radiation may either be resistant to removal or more prone to removal. After development and rinsing, the pattern of the mask is transferred to the substrate using a wet or dry etch process.

The evolution of chip design continually requires faster circuitry and greater circuit density. The demands for greater circuit density necessitate a reduction in the dimensions of the integrated circuit components. As the dimensions of the integrated circuit components are reduced, more elements are required to be placed in a given area on a semiconductor integrated circuit. Accordingly, the lithography process must transfer even smaller features onto a substrate, and lithography must do so precisely, accurately, and without damage. In order to precisely and accurately transfer features onto a substrate, high resolution lithography may use a light source that provides radiation at small wavelengths. Small wavelengths help to reduce the minimum printable size on a substrate or wafer. However, small wavelength lithography suffers from problems, such as low throughput, increased line edge roughness, and/or decreased resist sensitivity.

In a recent development, an electrode assembly is utilized to generate an electric field to a photoresist layer disposed on the substrate prior to or after an exposure process so as to modify chemical properties of a portion of the photoresist layer where the electromagnetic radiation is transmitted to for improving lithography exposure/development resolution. However, the challenges in implementing such systems have not been overcome.

Therefore, there is a need for improved methods and apparatus for improving photolithography processes.

SUMMARY

In one embodiment, a substrate processing apparatus is provided. The apparatus includes a chamber body defining a processing volume and a pedestal disposed within the processing volume. One or more fluid sources may be coupled to the processing volume through the pedestal and a drain may be coupled to the processing volume through the pedestal. A first electrode is coupled to the pedestal and a fluid containment ring is coupled to the pedestal radially outward of the first electrode. A moveable stem may be disposed opposite the pedestal and extend through the chamber body, and a second electrode may be coupled to the stem.

In another embodiment, a substrate processing apparatus is provided. The apparatus includes a chamber body defining a processing volume and a pedestal is disposed in the processing volume. A drain may be coupled to the processing volume through the pedestal, a first electrode may be coupled to the pedestal, and a fluid containment ring may be coupled to the pedestal radially outward of the first electrode. A moveable stem may be disposed opposite the pedestal and extend through the chamber body. A second electrode may be coupled to the stem and a dielectric containment ring may be coupled to the second electrode. One or more fluid sources may be coupled to the processing volume through the dielectric containment ring.

In yet another embodiment, a substrate processing apparatus is provided. The apparatus includes a chamber body defining a processing volume, a pedestal may be disposed in the processing volume, and a first electrode may be coupled to the pedestal. A moveable stem may be disposed opposite the pedestal and extend through the chamber body. A second electrode may be coupled to the stem and a dielectric containment ring may be coupled to the second electrode. An elastomeric O-ring may be coupled to the dielectric containment ring opposite the second electrode. One or more fluid sources, a drain, and a purge gas source may each be coupled to the processing volume through the dielectric containment ring.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
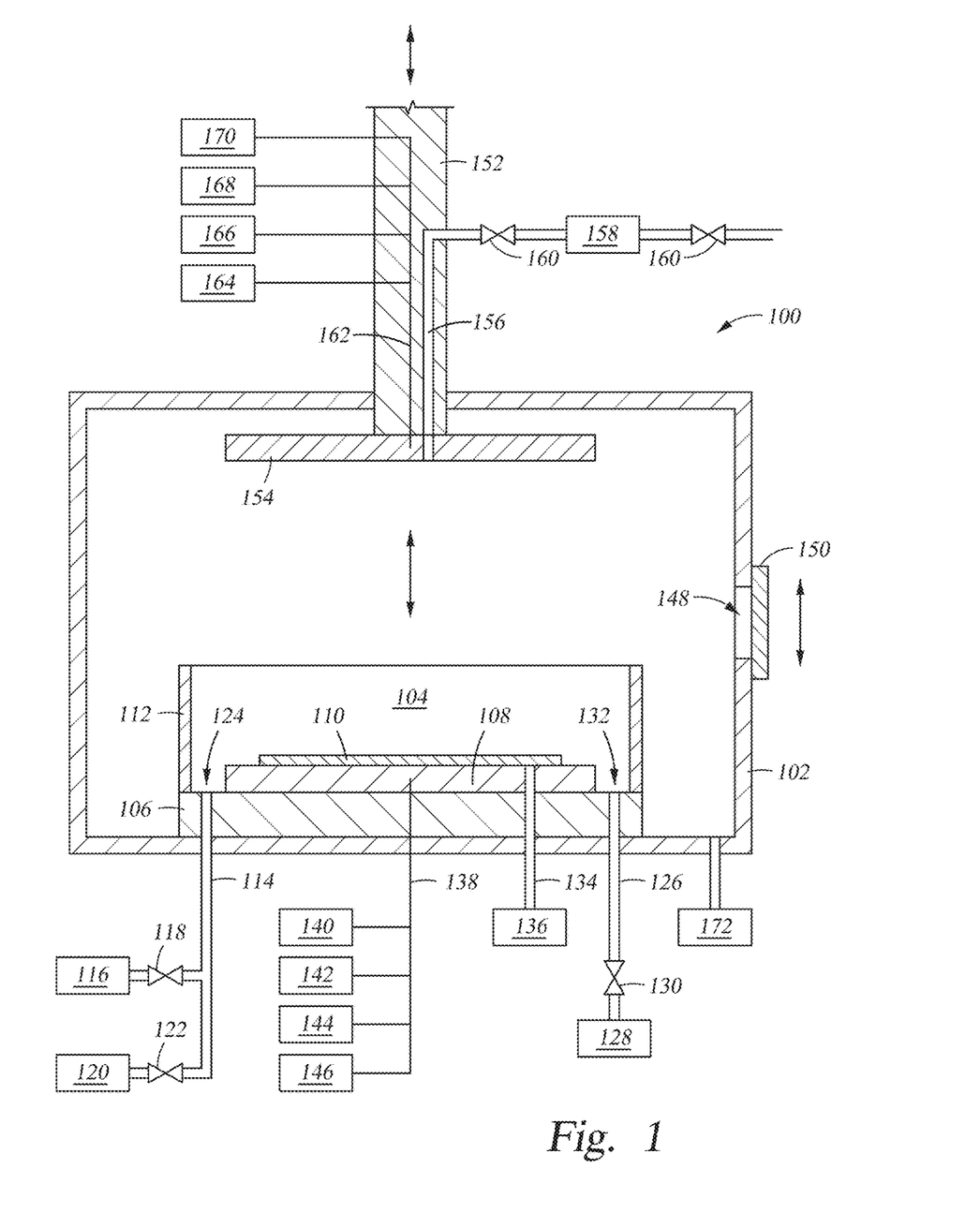
FIG. 1 schematically illustrates a cross-sectional view of an immersion field guided post exposure bake chamber according to one embodiment described herein.

FIG. 1 schematically illustrates a cross-sectional view of a processing chamber 100 according to one embodiment described herein. The processing chamber 100 includes a chamber body 102 which defines a processing volume 104. A pump 172 may be fluidly coupled to the processing volume 104 through the chamber body 102 and may be configured to generate a vacuum within the processing volume 104 or exhaust fluids and other materials from the processing volume 104. A slit valve 148 may be formed in the chamber body 102 to provide for ingress and egress of a substrate for processing. A slit valve door 150 may be coupled to the chamber body 102 adjacent the slit valve 148. Generally, the chamber body 102 may be formed from materials suitable for performing immersion field guided post exposure bake (iFGPEB) processes therein, such as aluminum, stainless steel, and alloys thereof. The chamber body 102 may also be formed from various other materials such as polymers, for example, polytetrafluoroethylene (PTFE), or high temperature plastics, such as polyether ether ketone (PEEK).

A pedestal 106 may be disposed in the processing volume 104 and may be coupled to the chamber body 102. In one embodiment, the pedestal 106 may be fixably coupled to the chamber body 102. In another embodiment, the pedestal 106 may be rotatably coupled to the chamber body 102. In this embodiment, a motor (not shown) may be coupled to the pedestal 106 and the motor may be configured to impart rotational movement to the pedestal 106. It is contemplated that rotation of the pedestal 106 may be utilized to spin dry substrates after processing of the substrates.

A first electrode 108 may be coupled to the pedestal 106. The first electrode 108 may be fixably coupled to the pedestal 106 or may be rotatably coupled to the pedestal 106. In embodiments where the first electrode 108 is rotatably coupled to the pedestal 106, the rotation of the first electrode 108 may be utilized to spin dry substrates after processing. The first electrode 108 may be formed from an electrically conductive metallic material. In addition, the material utilized for the first electrode 108 may be a non-oxidative material. The materials selected for the first electrode 108 may provide for desirable current uniformity and low resistance across the surface of the first electrode 108. In certain embodiments, the first electrode 108 may be a segmented electrode configured to introduce voltage non-uniformities across the surface of the first electrode 108. In this embodiment, a plurality of power sources may be utilized to power different segments of the first electrode 108.

A fluid containment ring 112 may be coupled to the pedestal 106 radially outward from the first electrode 108. The fluid containment ring 112 may be manufactured from a non-conductive material, such as a ceramic material or a high temperature plastic material. The pedestal 106 and the fluid containment ring 112 may have a substantially similar diameter and a distance radially inward from the fluid containment ring 112 to the first electrode 108 may be between about 0.1 cm and about 3.0 cm, such as between about 0.5 cm and about 2.0 cm, for example, about 1.0 cm. The fluid containment ring 112 may extend from the pedestal 106 to further define the processing volume 104. Generally, a top of the fluid containment ring 112 may be co-planar with or disposed below a plane occupied by the slit valve 148.

The pedestal 106 may include one or more conduits disposed therethrough and an integrally disposed heating apparatus (not shown) may be disposed within the pedestal 106 to preheat fluids traveling through the conduits. A process fluid source 116 may be fluidly coupled to the processing volume 104 via a conduit 114. The conduit 114 may extend from the process fluid source 116 through the chamber body 102 and the pedestal 106 to the processing volume 104. In one embodiment, a fluid outlet 124 may be formed in the pedestal 106 radially outward from the first electrode 108 and radially inward from the fluid containment ring 112. A valve 118 may be disposed on the conduit 114 between the fluid outlet 124 and the process fluid source 116. A rinse fluid source 120 may also be fluidly coupled to the processing volume 104 via the fluid conduit 114. A valve 122 may be disposed on the conduit 114 between the fluid outlet 124 and the rinse fluid source 120. The process fluid source 116 may be configured to deliver fluids utilized during application of an electrical field during an iFGPEB process. The rinse fluid source 120 may be configured to deliver fluids to rinse substrates after an iFGPEB process has been performed.

A drain 128 may be fluidly coupled to the processing volume 104 via a conduit 126. The conduit 126 may extend from the drain 128 through the chamber body 102 and the pedestal 106. In one embodiment, a fluid inlet 132 may be formed in the pedestal 106 radially outward from the first electrode 108 and radially inward from the fluid containment ring 112. A valve 130 may be disposed on the conduit 126 between the fluid inlet 132 and the drain 128. Fluids, such as fluid from the process fluid source 116 and the rinse fluid source 120, may be removed from the processing volume 104 via the fluid inlet 132 and drain 128.

A vacuum source 136 may be coupled via a conduit 134 to a top surface of the first electrode 108. The conduit 134 may extend through the chamber body 102, the pedestal 106, and the first electrode 108. As illustrated, a substrate 110 may be disposed on the first electrode 108. The conduit 134 may be positioned underneath a region covered by the substrate 110 when the substrate 110 is positioned on the first electrode 108. The vacuum source 136 may be configured to draw a vacuum to secure the substrate 110 to the first electrode 108. In certain embodiment, the vacuum source 136 and the conduit 134 may be optional if the substrate secured on the first electrode 108 by other means, such as electrostatic chucking or mechanical apparatus (i.e. rings, pins, etc.)

A heat source 140 may be electrically coupled to the first electrode 108 via a conduit 138. The heat source 140 may provide power to one or more heating elements, such as resistive heaters, disposed within the first electrode 108. It is also contemplated that the heat source 140 may provide power to heating elements disposed within the pedestal 106. The heat source 140 is generally configured to heat either the first electrode 108 and/or the pedestal 106 to facilitate preheating of fluid during iFGPEB processes. In one embodiment, the heat source 140 may be configured to heat the first electrode 108 to a temperature of between about 70° C. and about 130° C., such as about 110° C. In other embodiments, the heat source may be coupled to the conduits 114 to preheat fluids entering the processing volume 104 from the process fluid source 116 and/or the rinse fluid source 120. A temperature sensing apparatus 142 may also be coupled to the first electrode 108 via the conduit 138. The temperature sensing apparatus 142, such as a thermocouple or the like, may be communicatively coupled to the heat source 140 to provide temperature feedback and facilitate heating of the first electrode 108.

A power source 144 is also coupled to the first electrode 108 via the conduit 138. The power source 144 may be configured to supply, for example, between about 1 V and about 20 kV to the first electrode. Depending on the type of process fluid utilized, current generated by the power source 144 may be on the order of tens of nano-amps to hundreds of milliamps. In one embodiment, the power source 144 may be configured to generate electric fields ranging from about 1 kV/m to about 2 MeV/m. In some embodiments, the power source 144 may be configured to operate in either voltage controlled or current controlled modes. In both modes, the power source may output AC, DC, and/or pulsed DC waveforms. Square or sine waves may be utilized if desired. The power source 144 may be configured to provide power at a frequency of between about 0.1 Hz and about 1 MHz, such as about 5 kHz. The duty cycle of the pulsed DC power or AC power may be between about 5% and about 95%, such as between about 20% and about 60%.

The rise and fall time of the pulsed DC power or AC power may be between about 1 ns and about 1000 ns, such as between about 10 ns and about 500 ns. A sensing apparatus 146 may also be coupled to the first electrode 108 via the conduit 138. The sensing apparatus 146, such as a voltmeter or the like, may be communicatively coupled to the power source 144 to provide electrical feedback and facilitate control of the power applied to the first electrode 108. The sensing apparatus 146 may also be configured to sense a current applied to the first electrode 108 via the power source 144.

A moveable stem 152 may be disposed through the chamber body 102 opposite the pedestal 106. The stem 152 is configured to move in the Z direction (i.e. towards and away from the pedestal 106) and may be moved between a non-processing position as shown and a processing position (illustrated in FIG. 2). A second electrode 154 may be coupled to the stem 152. The second electrode 154 may be formed from the same materials as the first electrode 108. Similar to the first electrode 108, the second electrode 154 may be segmented in certain embodiments.

A purge gas source 158 may be fluidly coupled to the processing volume 104 via a conduit 156. The conduit 156 may extend from the purge gas source 158 through the stem 152 and the second electrode 154. In certain embodiments, the conduit 156 may be formed from a flexible material to accommodate movement of the stem 152. Although not illustrated, in an alternative embodiment, the conduit may extend through the stem 152 to the processing volume 104 and not the second electrode 154. A valve 160 may be disposed on the conduit 156 between the stem 152 and the purge gas source 158. Gases provided by the purge gas source 158 may include nitrogen, hydrogen, inert gases and the like to purge the processing volume 104 during or after iFGPEB processing. When desired, purge gases may be exhausted from the processing volume 104 via the pump 172.

A heat source 170, temperature sensing apparatus 168, a power source 166, and a sensing apparatus 164 may be communicatively coupled to the second electrode 154 via a conduit 162. The heat source 170, the temperature sensing apparatus 168, the power source 166, and the sensing apparatus 164 may be configured similarly to the heat source 140, the temperature sensing apparatus 142, the power source 144, and the sensing apparatus 146.

The embodiments described herein relate to methods as well as the apparatus for performing immersion field guided post exposure bake processes. The methods and apparatuses disclosed herein may increase the photoresist sensitivity and productivity of photolithography processes. The random diffusion of acids generated by a photoacid generator during a post-exposure bake procedure contributes to line edge/width roughness and reduced resist sensitivity. An electrode assembly may be utilized to apply an electric field to the photoresist layer during photolithography processes. The field application may control the diffusion of the charged species generated by the photoacid generator.

An air gap defined between the photoresist layer and the electrode assembly may result in voltage drop applied to the electrode assembly, thus, adversely lowering the level of the electric field desired to be generated to the photoresist layer. As a result of the voltage drop, levels of the electric field at the photoresist layer may result in insufficient or inaccurate voltage power to drive or create charged species in the photoresist layer in certain desired directions. Thus, diminished line edge profile control to the photoresist layer may prevalent.

An intermediate medium may be disposed between the photoresist layer and the electrode assembly to prevent the air gap from being created so as to maintain the level of the electric field interacting with the photoresist layer at a certain desired level. By doing so, the charged species generated by the electric field may be guided in a desired direction along the line and spacing direction, preventing the line edge/width roughness that results from inaccurate and random diffusion. Accordingly, a controlled or desired level of electric field as generated may increase the accuracy and sensitivity of the photoresist layer to exposure and/or development process. In one example, the intermediate medium may be non-gas phase medium, such as a slurry, gel, or liquid solution that may efficiently maintain voltage level as applied at a determined range when transmitting from the electrode assembly to the photoresist layer disposed on the substrate. Charges generated by the electric field may be transferred between the intermediate medium and the photoresist which may result in a net current flow. In certain embodiments, the net current flow may improve reactions characteristics, such as improving the reaction rate of the photoresist. Operating the power source 144 in a current controlled mode also advantageously enables control of the amount of charges that are transferred between the intermediate medium and the photoresist.

Figure 2:
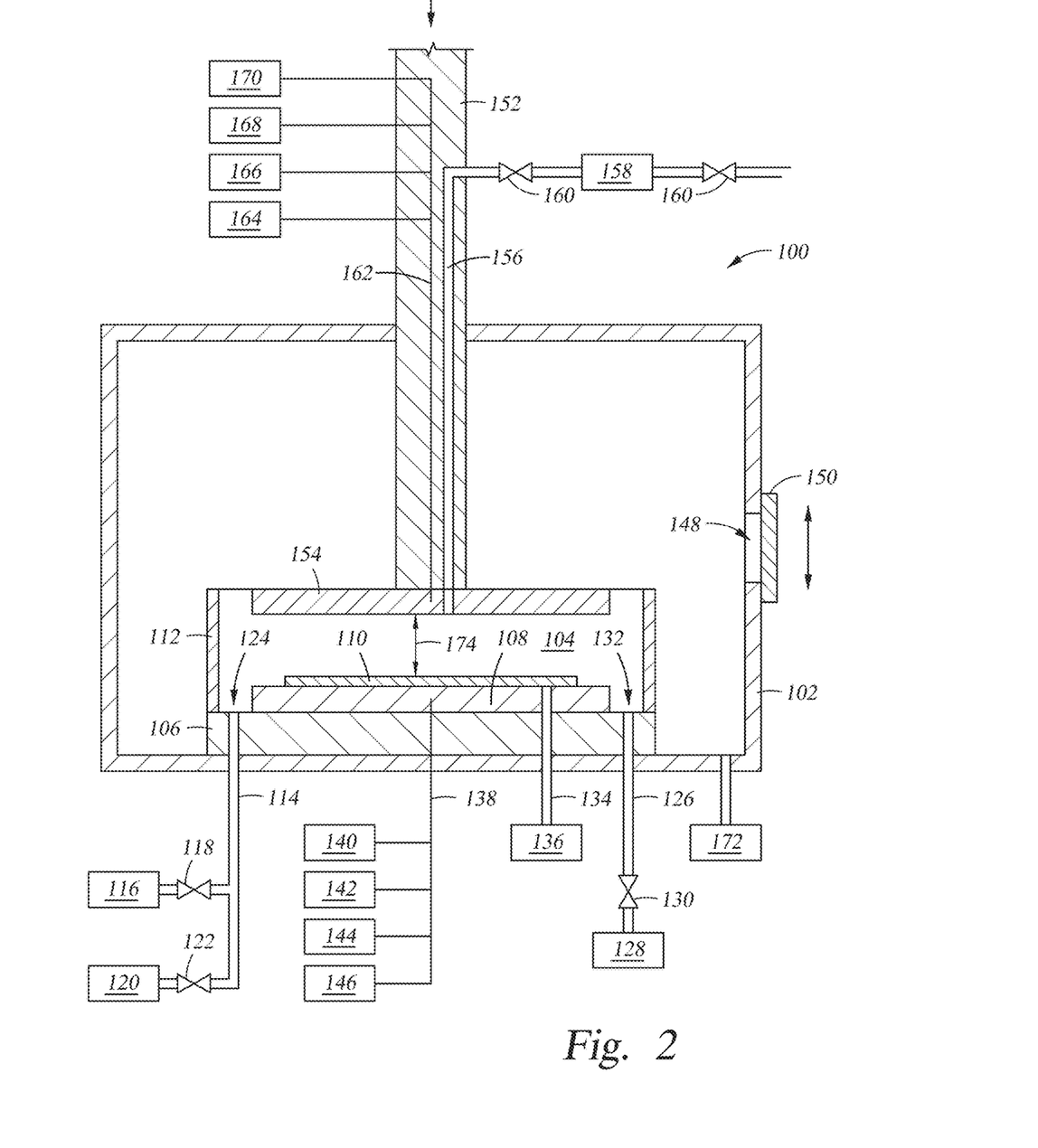
FIG. 2 schematically illustrates a cross-sectional view of the chamber of FIG. 1 in a processing position according to one embodiment described herein.

FIG. 2 schematically illustrates a cross-sectional view of the chamber 100 of FIG. 1 in a processing position according to one embodiment described herein. The stem 152 may be moved toward the pedestal 106 into a processing position. In the processing position, a distance 174 between the second electrode 154 and the substrate 110 may be between about 1 mm and about 1 cm, such as about 2 mm. Processing fluid may be delivered to the processing volume 104 defined and retained by the fluid containment ring 112 and the second electrode 154 may be partially or completely submerged when the stem 152 is located in the processing position. Power may be applied to one or both of the electrodes 108, 154 to perform an iFGPEB process.

In some embodiments, the first electrode 108 and the second electrode 154 are configured to generate an electric field parallel to the x-y plane defined by the substrate 110. For example, the electrodes 108, 154 may be configured to generate an electric field in one of the y direction, x direction or other direction in the x-y plane. In one embodiment, the electrodes 108, 154 are configured to generate an electric field in the x-y plane and in the direction of latent image lines, which may be patterned on the substrate 110. In another embodiment, the electrodes 108, 154 are configured to generate an electric field in the x-y plane and perpendicular to the direction of latent image lines patterned on the substrate 110. The electrodes 108, 154 may additionally or alternatively be configured to generate an electric field in the z-direction, such as, for example, perpendicular to the substrate 110.

Figure 3:
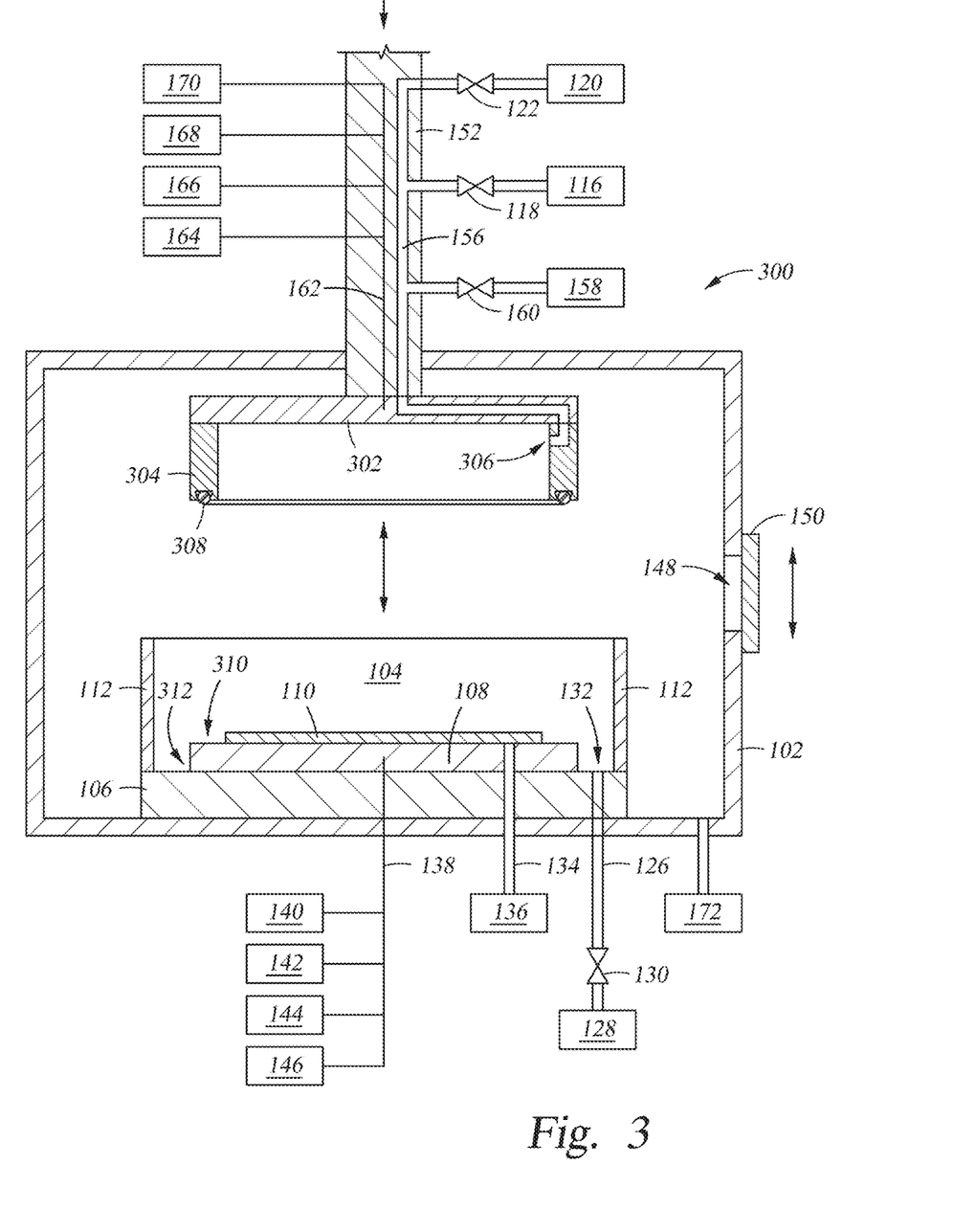
FIG. 3 schematically illustrates a cross-sectional view of an immersion field guided post exposure bake chamber according to one embodiment described herein.

FIG. 3 schematically illustrates a cross-sectional view of an iFGPEB chamber 300 according to one embodiment described herein. A third electrode 302 may be similar to the second electrode 154 in certain aspects. A dielectric containment ring 304 may be coupled to the third electrode 302 opposite the stem 152. The dielectric containment ring 304 may have a diameter similar to the diameter of the third electrode 302. The dielectric containment ring 304 may be formed from a dielectric material, such as polymers or ceramics with suitable dielectric properties. An O-ring 308 may be coupled to the dielectric containment ring 304 opposite the third electrode 302 and extend circumferentially about the dielectric containment ring 304. The O-ring 308 may be formed from an elastomeric material, such as a polymer and may be compressible when the stem 152 is disposed in a processing position.

For example, when the stem 152 is disposed in the processing position (illustrated in FIG. 2) the O-ring 308 may contact a region 310 of the first electrode 108 or a region 312 of the pedestal 106. The diameter of the third electrode 302 and the diameter of the dielectric containment ring 304 may be selected depending on the desired region 310, 312 of contact by the O-ring 308. It is contemplated that when the O-ring 308, and third electrode 302/dielectric containment ring 304 are configured to contact the region 312 on the pedestal 106, the point of contact by the O-ring 308 may be radially inward from the fluid inlet 132 to provide for unrestricted fluid access to the drain 128. The O-ring 308, when the stem 152 is disposed in the processing position, may also be sized and positioned to contact an exclusion zone of the substrate 110. Generally, the exclusion zone of the substrate 110 is a region of the substrate 110 radially inward a distance of about 1 mm to about 3 mm from the circumference of the substrate 110. In this embodiment, the processing volume 104 may be defined by the substrate 110, the dielectric containment ring 304, and the third electrode 302. Advantageously, a backside of the substrate 110 coupled to the first electrode 108 may remain unexposed to process or rinse fluids which aids in preventing fluid from entering the vacuum source 136.

The rinse fluid source 120 may be fluidly coupled with the processing volume 104 via the conduit 156 which may extend through the stem 152, the third electrode 302 and the dielectric containment ring 304. A fluid outlet 306 of the conduit 156 may be disposed at an inner diameter of the dielectric containment ring 304. The rinse fluid source 120 and the purge gas source 158 may also be coupled to the conduit 156. Alternatively, the fluid conduit 156 may extend through the stem 152 above the third electrode 302 and extend radially outward of the third electrode 302 through the dielectric containment ring 304 to the fluid outlet 306.

Figure 4:
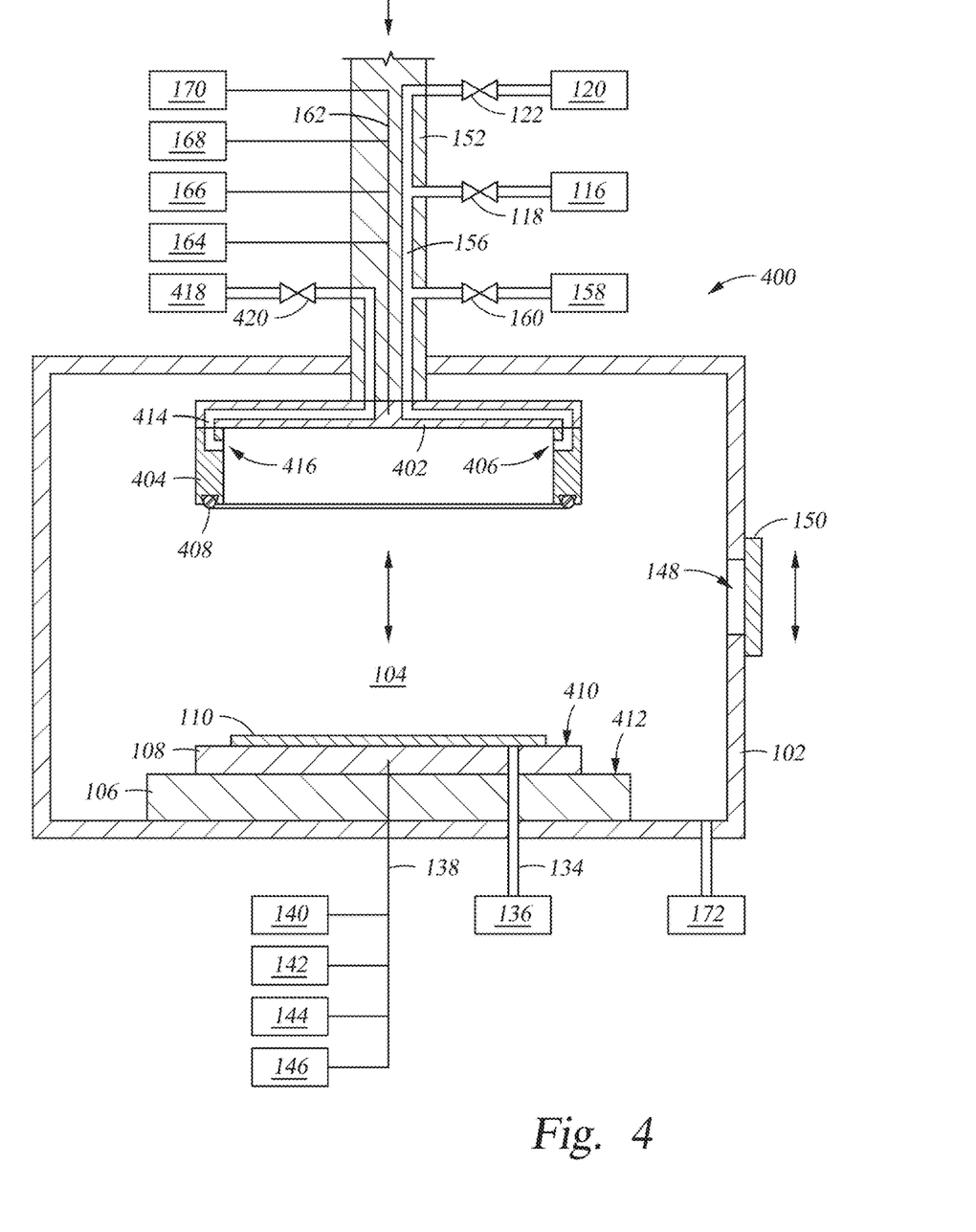
FIG. 4 schematically illustrates a cross-sectional view of an immersion field guided post exposure bake chamber according to one embodiment described herein.

FIG. 4 schematically illustrates a cross-sectional view of an iFGPEB chamber 400 according to one embodiment described herein. The chamber 400 is similar to the chamber 300 in certain aspects, however, the fluid containment ring 112 is not coupled to the pedestal 106. An exhaust 418 may be fluidly coupled to the processing volume 104 via a conduit 414 which may extend through the stem 152, a fourth electrode 402 (which is coupled to the stem 152), and a dielectric containment ring 404. In certain embodiments, the conduit 414 may be formed from a flexible material to accommodate movement of the stem 152. A fluid outlet 416 of the conduit 414 may be disposed at an inner diameter of the dielectric containment ring 404. A valve may be disposed on the conduit 414 between the exhaust 418 and the stem 152. Alternatively, the conduit 414 may extend through the stem 152 above the fourth electrode 402 and extend radially outward of the fourth electrode 402 through the dielectric containment ring 404 to the fluid outlet 416.

Similar to the chamber 300, when the stem 152 is disposed in a processing position (illustrated in FIG. 2), the fourth electrode 402, the dielectric containment ring 404, and an O-ring 408 coupled circumferentially about the dielectric containment ring 404 opposite the fourth electrode 402, may be sized such that the O-ring 408 contacts either the region 410 on the first electrode 108 or the region 412 of the pedestal 106. During processing, various process and rinse fluid may be introduced to the processing volume 104 which is further defined by the dielectric containment ring 404 and the fourth electrode 402. The fluids may be exhausted from the processing volume 104 via the fluid outlet 416 to the exhaust 418.

Although not shown in FIGS. 1-4, lift pins may extend through the pedestal 106 and/or first electrode 108 to facilitate positioning of the substrate 110 on the first electrode 108. For example, when the stem 152 is in a non-processing raised position, the lift pins may extend upward and receive a substrate from a robot blade extending through the slit valve 148. The lift pins may then retract and position the substrate 110 on the first electrode 108.

Figure 5:
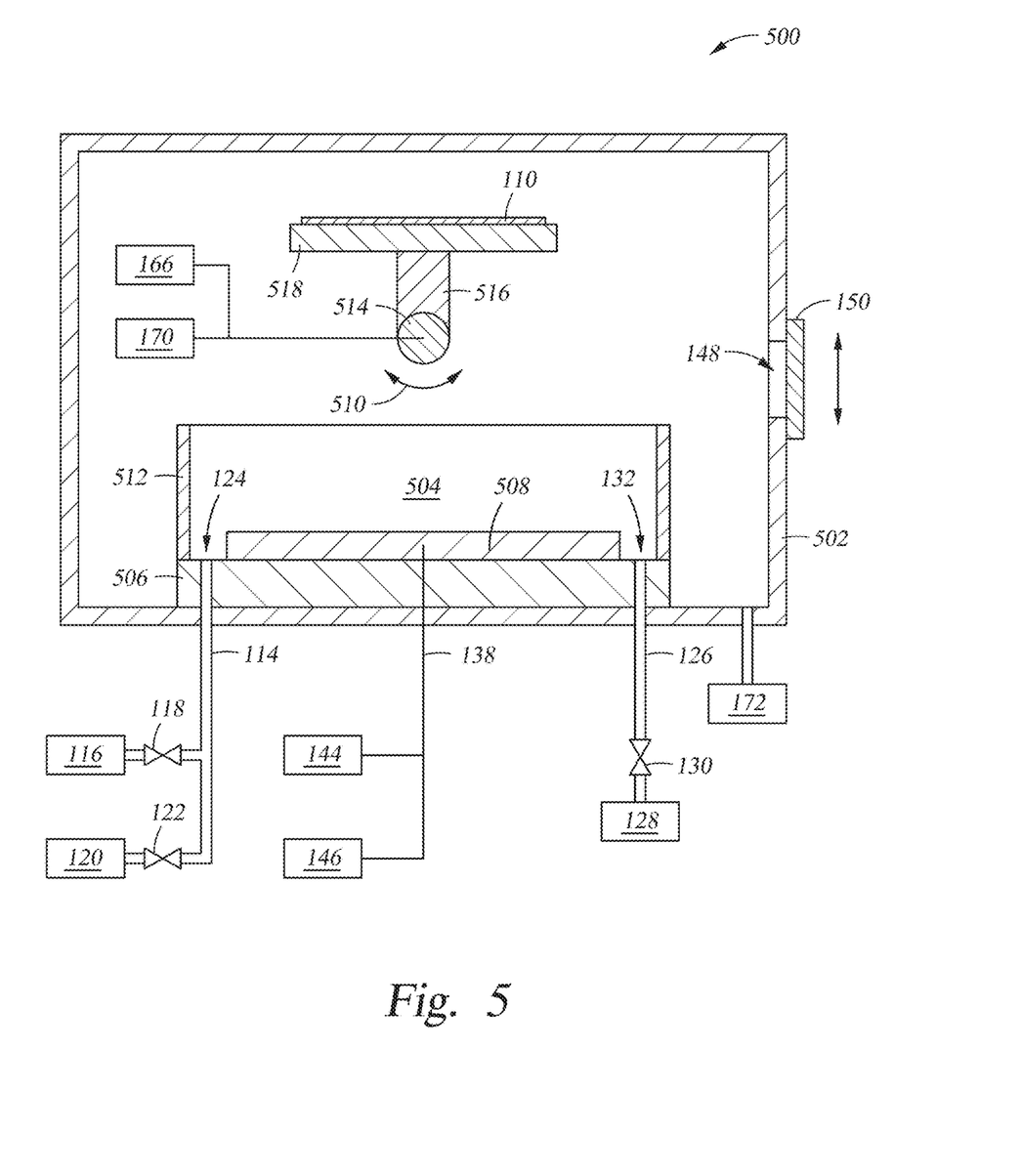
FIG. 5 schematically illustrates a cross-sectional view of an immersion field guided post exposure bake chamber according to one embodiment described herein.

FIG. 5 schematically illustrates a cross-sectional view of an iFGPEB chamber 500 according to one embodiment described herein. The chamber 500 includes a chamber body 502 defining a processing volume 504, a pedestal 506, a first electrode 508, and a fluid containment ring 512 which may be similar in certain aspects to the chamber body 102, the processing volume 104, the pedestal 106, the first electrode 108, and the fluid containment ring 112, except that the components of the chamber 500 are sized to accommodate a rotational stem 516 and a second electrode 518 coupled to the rotational stem 516. The rotational stem 516 may be rotatably coupled to a bearing member 514. The bearing member 514 may be coupled to the chamber body 502 such that the bearing member 514 rotates about an X or Y (horizontal) axis.

Figure 6:
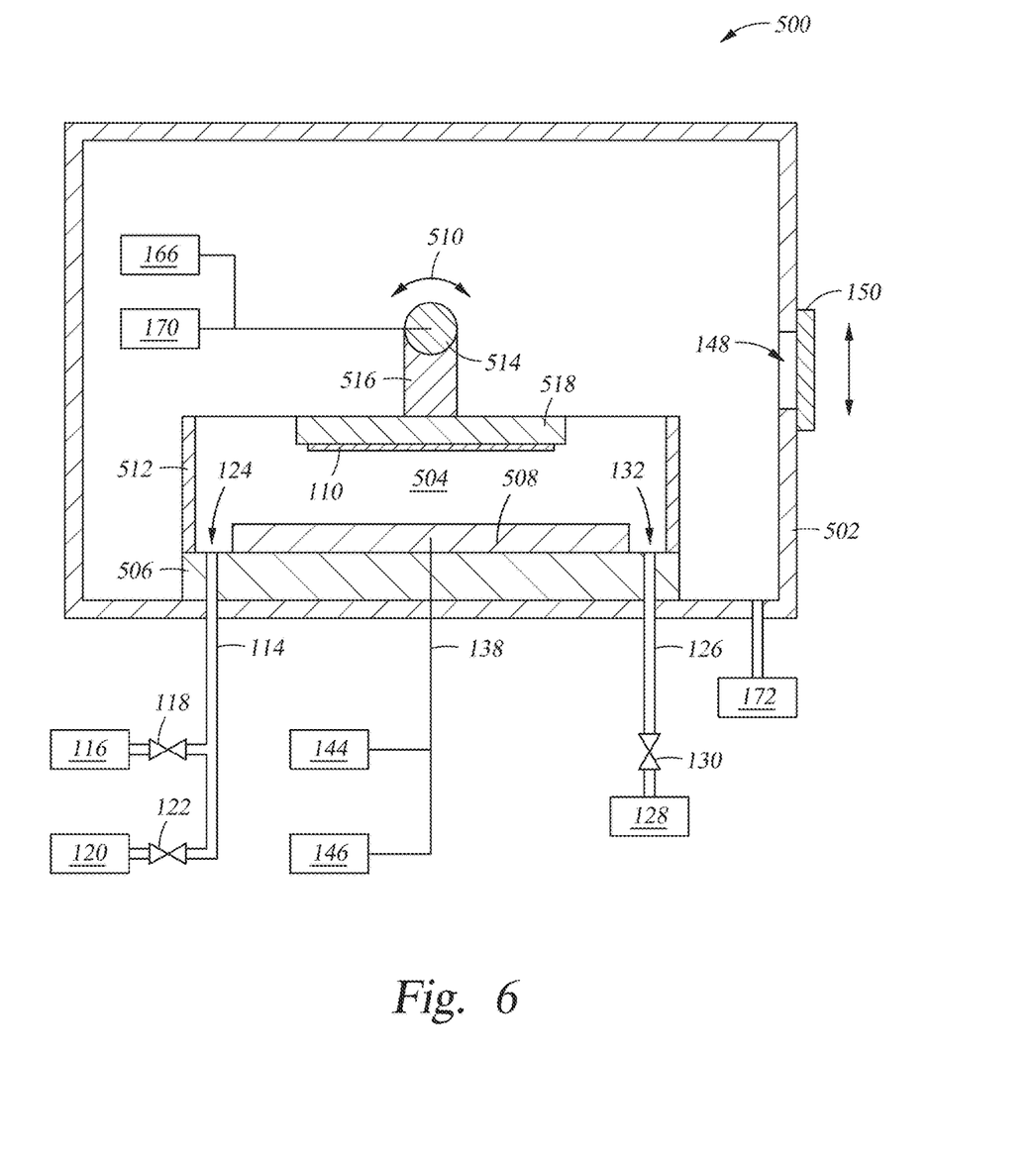
FIG. 6 schematically illustrates a cross-sectional view of the chamber of FIG. 5 in a processing position according to one embodiment described herein.

The substrate 110 may be disposed on the second electrode 518 in the non-processing position illustrated in FIG. 5. FIG. 6 illustrates the chamber 500 of FIG. 5 in a processing position. The rotatable stem 516, having received the substrate 110 on the second electrode 518, may rotate about the horizontal axis to the processing position as illustrated. Fluid supplied to the processing volume 504 further defined by the fluid containment ring 512 may be in an amount suitable to partially or entirely submerge the second electrode 518. An iFGPEB process may be performed and the rotatable stem 516 may rotate back to the non-processing position. The bearing member 514 may also be configured to rotate about the Z axis (vertical) to spin the rotatable stem 516 and second electrode 518 to expel fluid remaining on the substrate 110.

Figure 7:
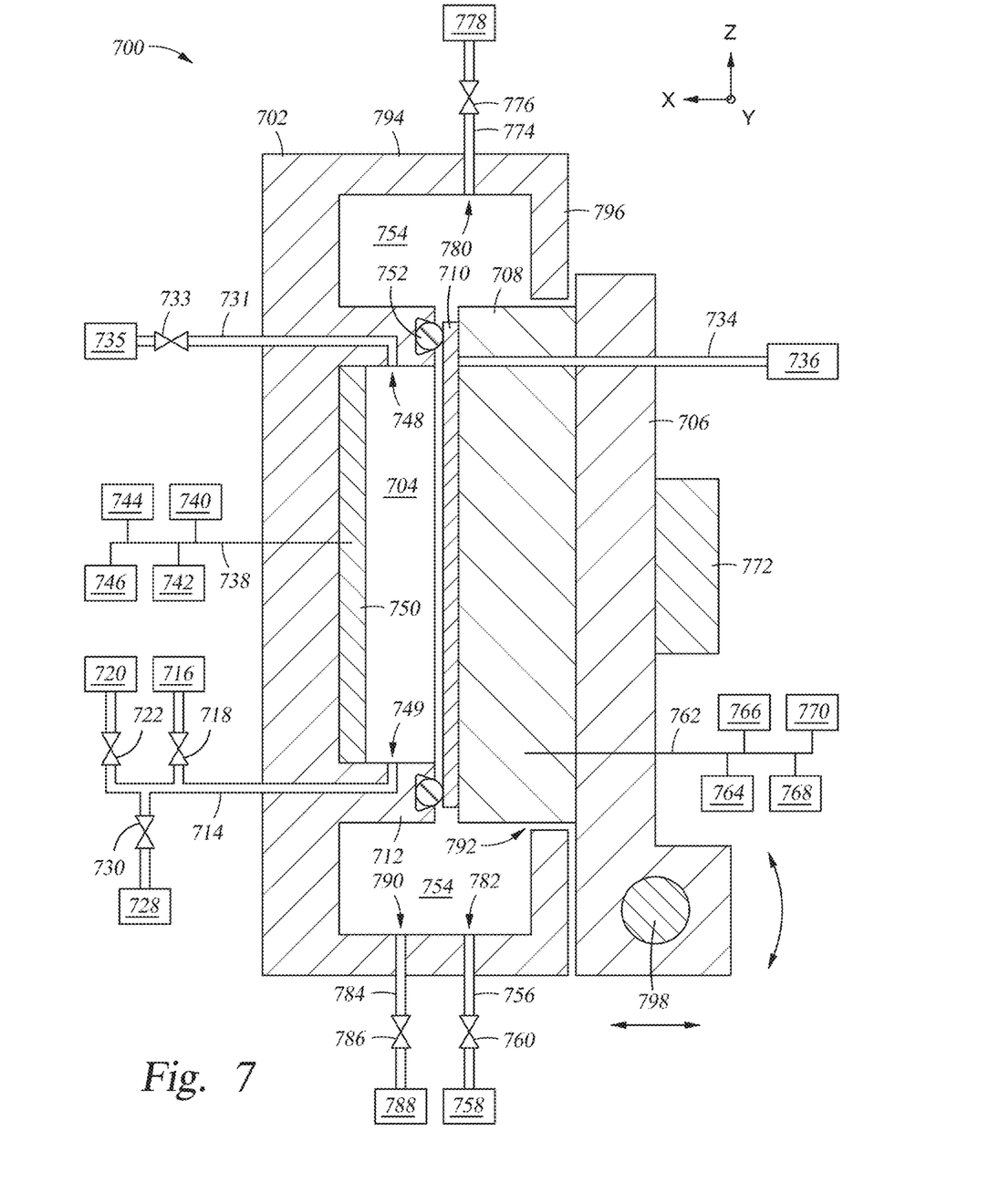
FIG. 7 schematically illustrates a cross-sectional view of an immersion field guided post exposure bake chamber according to one embodiment described herein.

FIG. 7 schematically illustrates a cross-sectional view of an immersion field guided post exposure bake chamber 700 according to one embodiment described herein. The chamber 700 includes a chamber body 702, which may be manufactured from a metallic material, such as aluminum, stainless steel, and alloys thereof. The chamber body 702 may also be formed from various other materials such as polymers, for example, polytetrafluoroethylene (PTFE), or high temperature plastics, such as polyether ether ketone (PEEK). The body 702 includes a fluid containment ring 712 which may extend from the body 702 and at least partially define a first processing volume 704. The body 702 may also include sidewalls 794 and a lid 796 which extends from the sidewalls 794. The body 702, the fluid containment ring 712, the sidewalls 794, and the lid 796 may define a second processing volume 754 which is formed radially outward from the first processing volume 704. An opening 792 may be defined by the lid 796 and the opening 792 may be sized to accommodate passage of a substrate 710 therethrough.

A door 706 may be operably coupled to the chamber body 702 and disposed adjacent the lid 796. The door 706 may be formed from materials similar to materials selected for the chamber body 702 and a shaft 798 may extend through the door 706. Alternatively, the chamber body 702 may be formed from a first material, such as a polymer, and the door 706 may be formed from a second material, such as a metallic material. The door 706 may be coupled to a track (not shown) and the door may be configured to translate along the track in the X-axis. A motor (not shown) may be coupled to the door and/or the track to facilitate movement of the door 706 along the X-axis. Although the door 706 is illustrated in a processing position, the door 706 may be configured to rotate about the shaft 798 around the Z-axis. Prior to rotating, the door 706 may move away from the chamber body 702 along the X-axis and clear the lid 796 prior to rotating. For example, the door 706 may rotate about 90° from the illustrated processing position to a loading position where the substrate 710 may be loaded and unloaded from a first electrode 708 coupled to the door 706.

The first electrode 708, which may be similar to the first electrode 108, is sized to accommodate attachment of the substrate 710 thereon. The first electrode 708 may also be sized to allow for passage through the opening 792 defined by the lid 796. In one embodiment, the first electrode 708 may be fixably coupled to the door 706. In another embodiment, the first electrode 708 may be rotatably coupled to the door 706. In this embodiment, a motor 772 may be coupled to the door 706 opposite the first electrode 708 and the motor 772 may be configured to rotate the first electrode 708 about the X-axis. Rotation of the first electrode 708 may be utilized to spin dry the substrate 710 after iFGPEB processing. To perform spin drying, the door 706 may translate along the X-axis away from the fluid containment ring 712 such that the substrate 710 has not passed through the opening 792. The motor 772 may be activated to spin the first electrode 708 (with the substrate 710 chucked to the first electrode) to remove fluids from surfaces of the substrate 710.

A vacuum source 736 may be in fluid communication with a substrate receiving surface of the first electrode 708. The vacuum source 736 may be coupled to a conduit 734 which extends from the vacuum source 736 through the door 706 and the first electrode 708. Generally, the vacuum source 736 is configured to vacuum chuck the substrate 710 to the first electrode 708. A heat source 764, a temperature sensing apparatus 766, a power source 768, and a sensing apparatus 770 may also be coupled to the first electrode 708 via a conduit 762. The heat source 764, the temperature sensing apparatus 766, the power source 768, and the sensing apparatus 770 may be similarly configured to the heat source 140, the temperature sensing apparatus 142, the power source 144, and the sensing apparatus 146 described in greater detail with regard to FIG. 1.

A second electrode 750 may be coupled to the chamber body 702. The fluid containment ring 712 may surround the second electrode 750 such that the first processing volume 704 is defined (when the door 706 is in the processing position) by the second electrode 750, the fluid containment ring 712, and the substrate 710. An O-ring 752 may be coupled to the fluid containment ring 712 and the O-ring 752 may be formed from an elastomeric material, such as a polymer or the like. A circumference defined by the O-ring 752 may be sized to contact an exclusion zone of the substrate 710 when the substrate 710 is in the processing position as illustrated. The O-ring 752 may also be sized to contact an edge of the substrate 710. By contacting the substrate 710, it is contemplated that the O-ring 752 may prevent fluid from escaping the first processing volume 704 and reduce or eliminate the possibility of fluid entering the vacuum source 736.

A process fluid source 716 may fluidly coupled to the first processing volume 704 via a conduit 714. The conduit 714 may extend from the process fluid source 716 through the chamber body 702 and the fluid containment ring 712 to an inlet 749 adjacent the first processing volume 704. A valve may be disposed on the conduit 714 between the inlet 749 and the process fluid source 716 to control delivery of processing fluid to the first processing volume 704. A first rinse fluid source 720 may also be fluidly coupled to the first processing volume 704 via the conduit 714. A valve 722 may be disposed on the conduit 714 between the inlet 749 and the first rinse fluid source 720 to control delivery of rinse fluid to the first processing volume 704. The process fluid source 716 and the first rinse fluid source 720 may be similar to the process fluid source 116 and the rinse fluid source 120, respectively, which are described with regard to FIG. 1.

A first drain 728 may be in fluid communication with the first processing volume 704 via the conduit 714. A valve 730 may be disposed on the conduit 714 between the inlet 749 and the drain 728. Given the vertical orientation of the chamber 700, the drain 728 in fluid communication with the first processing volume 704 via the fluid inlet 749 may provide for improved efficiency when removing process fluid or rinse fluid from the first processing volume 704. An exhaust 735 may also be in fluid communication with the first processing volume 704 via a conduit 731. The conduit 731 may extend through the chamber body 702 and the fluid containment ring 712 to a fluid outlet 748 adjacent the first processing volume 704. A valve 733 may be disposed on the conduit 731 between the outlet 748 and the exhaust 735.

In operation, process fluid may be provided to the first processing volume 704 from the process fluid source 716 and an iFGPEB process may be performed. Any gaseous fluid in the first process volume 704 may rise toward the fluid outlet 748 as the first processing volume 704 is filled with a liquid process fluid. Accordingly, gaseous fluids may be removed from the first processing volume 704 by the exhaust 735. Process fluid may be removed from the first processing volume 704 via the fluid inlet 749 and drain 728 after iFGPEB processing. Optionally, rinse fluids supplied to the first processing volume 704 via the first rinse fluid source 720 may be subsequently utilized with the substrate 710 in the processing position. Similar to the process fluids, the rinse fluids may be removed from the first processing volume 704 via the fluid inlet 749 and the drain 728.

A second rinse fluid source 778 may be in fluid communication with the second processing volume 754 via a conduit 774. The conduit 774 may extend from the second rinse fluid source 778 through the sidewalls 794 to an outlet 780. A valve 776 may be dispose on the conduit 774 between the outlet 780 and the second rinse fluid source 778 to control delivery of rinse fluid to the second processing volume 754. In one embodiment, after iFGPEB processing of the substrate 710 in the illustrated processing position, the door 706 may be moved away from the processing position along the X-axis such that the substrate 710 is positioned in a similar X-axis plane as the outlet 780 (i.e. a rinsing position). Once the substrate 710 is positioned in the rinsing position, rinse fluid from the second rinse fluid source 778 may be delivered to the second processing volume 754 and the substrate 710. During and/or after rinsing, the substrate 710 may be spun by the motor 772 to expel rinse fluid and other fluids/particles from the substrate 710.

A second drain 788 may also be in fluid communication with the second processing volume 754. The second drain 788 may be fluidly coupled to the second processing volume 754 via a conduit 784 which extends from the second drain 788 through the sidewalls 794 to an inlet 790. A valve 786 may be disposed on the conduit 784 between the inlet 790 and the second drain 788 to control removal of fluids/particles from the second processing volume 754. In operation, rinse fluids from the second rinse fluid source 778 may rinse the substrate 710 and be removed from the second processing volume 754 via the second drain 788.

A purge gas source 758 may also be in fluid communication with the second processing volume 754. The purge gas source 758 may be fluidly coupled to the second processing volume 754 via a conduit 756 which extends from the purge gas source 758 through the sidewalls 794 to an outlet 782. A valve 760 may be disposed on the conduit 756 between the outlet 782 and the purge gas source 758 to control delivery of purge gas to the second processing volume 754. In operation, purge gas may be provided during iFGPEB processing and/or during rinsing of the substrate 710 to prevent particle accumulation within the processing volumes 704, 754. Purge gas from the purge gas source 758 may be removed from the processing volumes 704, 754 via the exhaust 735.

Figure 8:
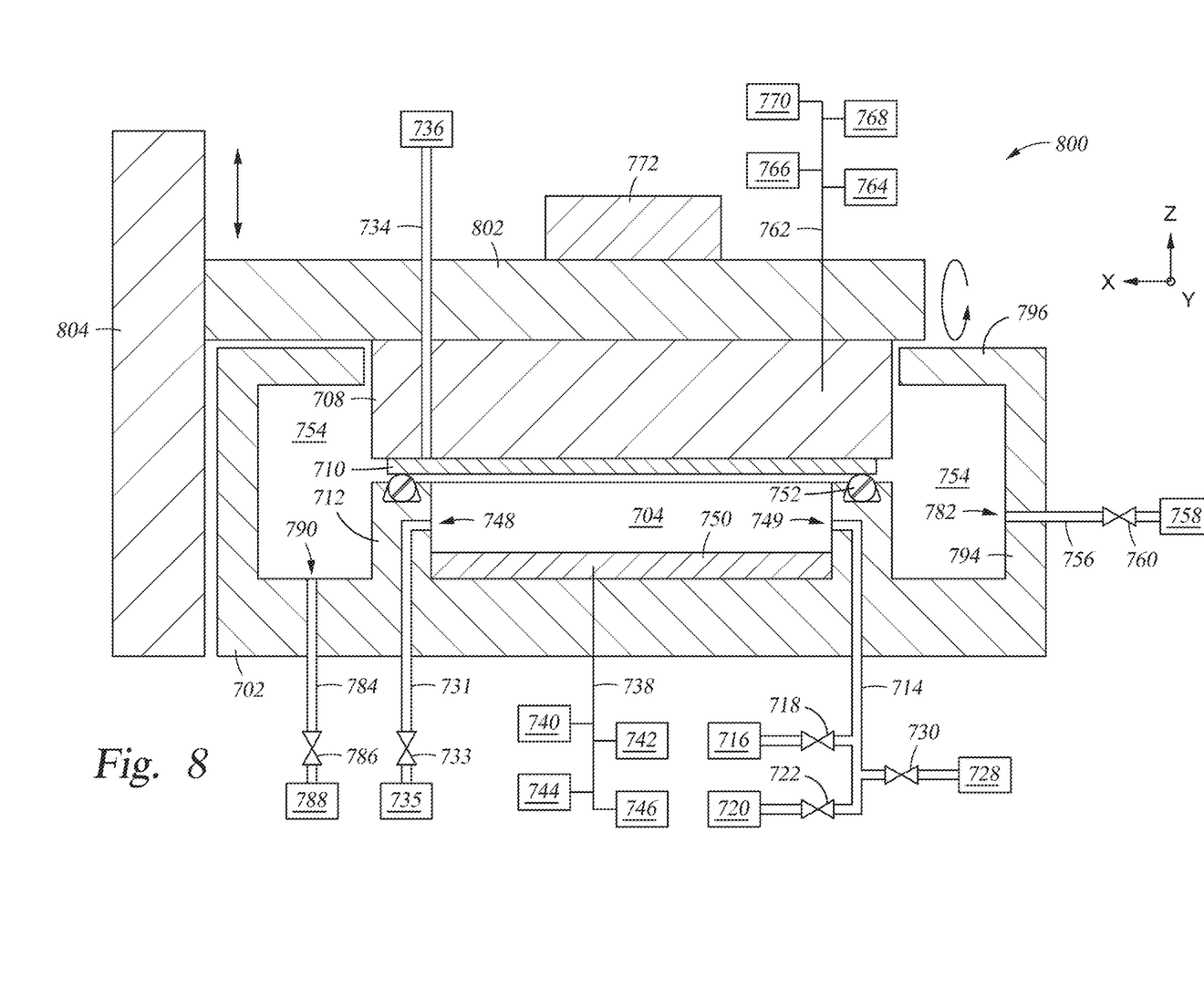
FIG. 8 schematically illustrates a cross-sectional view of an immersion field guided post exposure bake chamber according to one embodiment described herein.

FIG. 8 schematically illustrates a cross-sectional view of an immersion field guided post exposure bake chamber 800 according to one embodiment described herein. The chamber 800 is similar to the chamber 700, however, the chamber 800 is oriented in a horizontal position instead of a vertical position. A door 802, which has the first electrode 708 coupled thereto, may be slidably coupled to a lift member 804. The door 802 is illustrated in a processing position and may be move vertically along the Z-axis by the lift member 804 to a non-processing position away from the lid 796. In the non-processing position, the door 802 may rotate about the X-axis 180° such that the first electrode 708 and the substrate 710 are disposed above the door 802 (i.e. loading position). In the loading position, the substrates may be positioned on and removed from the first electrode 708. In operation, the substrate 710 may be secured on the first electrode 708 when the door 802 is in the loading position and the door may rotate 180°. The lift member 804 may lower the door 802 along the Z-axis to the illustrated processing position and iFGPEB processing may be performed.

Figure 9:
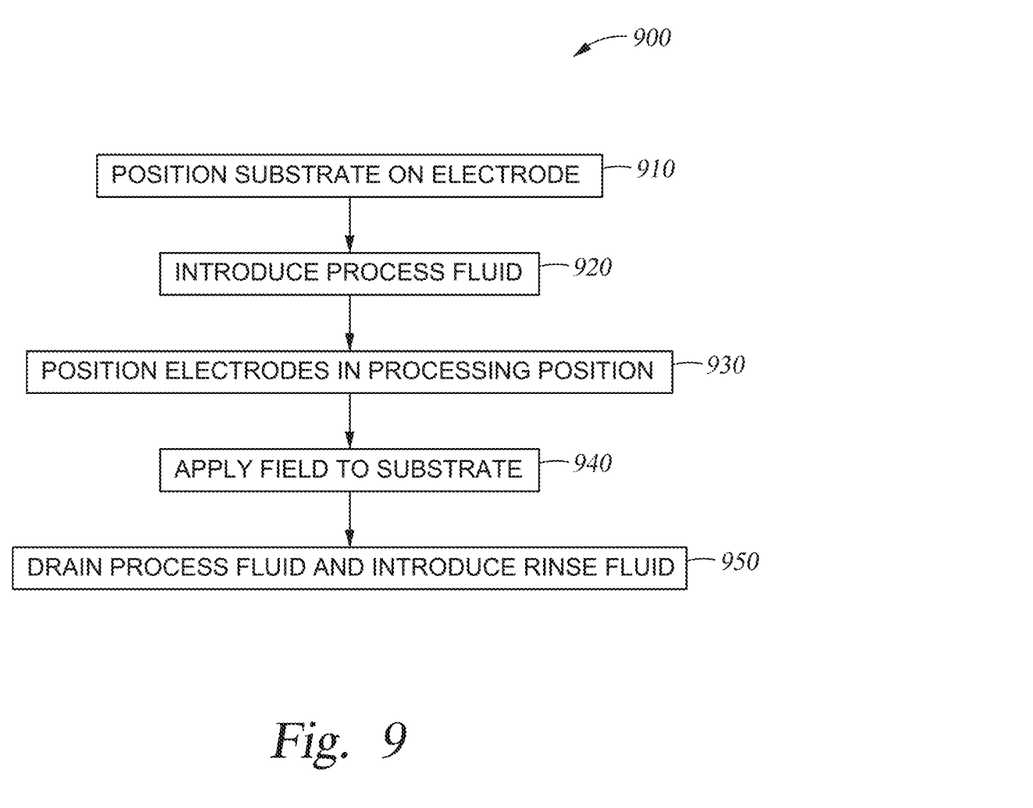
FIG. 9 illustrates operations of a method for performing an immersion post exposure bake process according to one embodiment described herein.

FIG. 9 illustrates operations of a method 900 for performing an iFGPEB process. At operation 910, a substrate may be positioned on a first electrode. The first electrode may be preheated prior to positioning of the substrate thereon. At operation 920, process fluid may be introduced to a processing volume containing the substrate. The process fluid may also be preheated to processing temperatures prior to introduction in to the processing volume. A second electrode may be moved to a processing position at operation 930. The positioning of the second electrode may be performed prior to, during, or after introduction of the process fluid in operation 920.

At operation 940, an electric field may be applied to the substrate via the first and/or second electrodes. In one embodiment, the field may be applied to the substrate for an amount of time between about 60 seconds and about 90 seconds. After application of the field, the process fluid may be drained and a rinse fluid may be introduced at operation 950. The rinse fluid may be removed from the substrate by spinning the substrate and subsequently drained from the processing volume. A purge gas may be introduced into the processing volume during or after the rinsing and spinning. The purge gas may provide for improved particle reduction after utilization of the process fluid and the rinse fluid. The second electrode may also be returned to a non-processing position and the substrate may be removed from the processing chamber. After removal from the processing chamber, the substrate may be positioned on a cooling pedestal to cool the substrate to room temperature prior to subsequent processing.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   positioning a substrate on a first electrode within a process volume;

moving a second electrode to a process position adjacent the substrate;
introducing a process fluid to the process volume;
generating an electric field between the first electrode and the second electrode and applying the electric field to the substrate via the process fluid;
removing the process fluid from the process volume;
introducing a rinse fluid to the process volume;
rotating the substrate to remove the rinse fluid from the substrate; and
removing the rinse fluid from the process volume.

2. The method of claim 1, wherein a purge gas is introduced to the process volume during the rotating the substrate.

3. The method of claim 1, wherein a purge gas is introduced to the process volume during the removing the rinse fluid from the process volume.

4. The method of claim 1, wherein the first electrode is preheated prior to the positioning a substrate on the first electrode.

5. The method of claim 1, wherein the process fluid is preheated prior to the introducing a process fluid to the process volume.

6. The method of claim 1, wherein the applying the electric field to the substrate is performed for an amount of time between about 60 seconds and about 90 seconds.

7. A substrate processing method, comprising:
positioning a substrate on a first electrode within a process volume;
moving a second electrode to a process position adjacent the substrate;
introducing a process fluid to the process volume, wherein the moving the second electrode to the process position is performed prior to, during, or after the introducing the process fluid to the process volume;
generating an electric field between the first electrode and the second electrode and applying the electric field to the substrate via the process fluid; and
removing the process fluid from the process volume.

8. A substrate processing method, comprising:
positioning a substrate on a first electrode within a process volume;
moving a second electrode to a process position adjacent the substrate;
introducing a process fluid to the process volume;
generating an electric field between the first electrode and the second electrode and applying the electric field to the substrate via the process fluid;
removing the process fluid from the process volume;
removing the substrate from the process volume; and
positioning the substrate on a cooling pedestal.

9. A substrate processing method, comprising:
positioning a substrate on a first electrode within a process volume;
moving the first electrode to a process position adjacent a second electrode disposed in the process volume;
introducing a process fluid to the process volume between the substrate and the second electrode;
generating an electric field between the first electrode and the second electrode and applying the electric field to the substrate via the process fluid;
removing the process fluid from the process volume;
introducing a rinse fluid to the process volume;
rotating the substrate to remove the rinse fluid from the substrate; and
removing the rinse fluid from the process volume.

10. The method of claim 9, wherein a purge gas is introduced to the process volume during the rotating the substrate or during the removing the rinse fluid from the process volume.

11. The method of claim 9, wherein the first electrode is preheated prior to the positioning a substrate on the first electrode or preheated prior to the introducing a process fluid to the process volume.

12. A substrate processing method, comprising:
positioning a substrate on a first electrode within a process volume;
moving the first electrode to a process position adjacent a second electrode disposed in the process volume;
introducing a process fluid to the process volume between the substrate and the second electrode, wherein the moving the first electrode to the process position is performed prior to, during, or after the introducing the process fluid to the process volume; and
generating an electric field between the first electrode and the second electrode and applying the electric field to the substrate via the process fluid.

13. A substrate processing method, comprising:
positioning a substrate on a first electrode coupled to a chamber door;
rotating the chamber door to a process position in which a major axis of the substrate is oriented vertically;
delivering a process fluid to a process volume, wherein the process volume is at least partially defined by chamber sidewalls and a second electrode; and
generating an electric field between the first electrode and the second electrode and applying the electric field to the substrate via the process fluid.

14. The method of claim 13, wherein the positioning a substrate on a first electrode comprises vacuum chucking the substrate to the first electrode.

15. The method of claim 13, wherein the process fluid is delivered to the process volume via a fluid inlet formed in the chamber sidewalls.

16. The method of claim 13, further comprising:
removing the process fluid from the process volume;
introducing a rinse fluid to the process volume;
rotating the substrate to remove the rinse fluid from the substrate; and
removing the rinse fluid from the process volume.

17. The method of claim 16, wherein a purge gas is introduced to the process volume during the rotating the substrate or during the removing the rinse fluid from the process volume.

18. The method of claim 13, wherein the first electrode is preheated prior to the positioning a substrate on the first electrode or preheated prior to the delivering a process fluid to the process volume.

* * * * *